United States Patent [19]
Tateishi

[11] Patent Number: 5,262,688
[45] Date of Patent: Nov. 16, 1993

[54] OPERATIONAL AMPLIFIER CIRCUIT

[75] Inventor: Tetsuo Tateishi, Kariya, Japan

[73] Assignee: Kabushiki Kaisha Toyoda Jidoshokki Seisakusho, Kariya, Japan

[21] Appl. No.: 809,872

[22] Filed: Dec. 18, 1991

[30] Foreign Application Priority Data

Dec. 19, 1990 [JP] Japan ................... 2-403734

[51] Int. Cl.$^5$ ................ H03K 5/22; G06G 7/12; G06G 7/10
[52] U.S. Cl. .................... 307/491; 307/494; 307/263; 307/552; 307/557; 330/252
[58] Field of Search ............... 307/491, 494, 553, 263, 307/552, 557; 330/252, 253, 257, 255, 259, 260, 261; 328/128

[56] References Cited

U.S. PATENT DOCUMENTS

| 4,577,121 | 3/1986 | Sano et al. | 307/494 |
| 4,700,087 | 10/1987 | Stroberger | 307/546 |
| 4,785,258 | 11/1988 | Westwick | 330/260 |
| 4,871,977 | 10/1989 | Schilling et al. | 330/255 |
| 4,893,092 | 1/1990 | Okamoto | 330/253 |
| 4,922,208 | 5/1990 | Susak et al. | 330/255 |

Primary Examiner—Timothy P. Callahan
Attorney, Agent, or Firm—Brooks, Haidt, Haffner & Delahunty

[57] ABSTRACT

An operational amplifier circuit having a phase-compensating capacitor disposed between the output of an amplifier circuit as a first stage and the output of an amplifier circuit as a second stage is provided with a potential holding circuit for maintaining the potential at a node A between the first and second stages at a given value so as to control a drop in the potential at the node A, thereby making it possible to prevent a response delay from occurring in a transition waveform of an output from the second stage upon the charging of the phase-compensating capacitor.

16 Claims, 3 Drawing Sheets

OPERATIONAL AMPLIFIER CIRCUIT

BACKGROUND OF THE INVENTION

1. Field of the Invention

The present invention relates to an operational amplifier circuit comprising a differential-amplification type amplifier circuit as a first stage and an amplifier circuit as a second stage.

2. Description of the Related Art

There has heretofore been known an operational amplifier (hereinafter abbreviated as "OP amp") circuit provided with a differential-amplification type amplifier circuit 41 as a first stage and an amplifier circuit 42 as a second stage as shown in FIG. 5 by way of example.

The amplifier circuit 41 has a pair of emitter-coupled input transistors 43, 44. The base of the input transistor 43 is used as a minus input IN− side and supplied with an input signal, whereas the base of the input transistor 44 is used as a plus input IN+ side and supplied with an input signal. The emitters of the input transistors 43, 44 are electrically connected to a power line 46 through a constant-current circuit 45. In addition, the collectors of the input transistors 43, 44 are electrically connected to the collectors of a pair of transistors 48, 49, respectively, which constitute a current mirror circuit 47. The emitters of the transistors 48, 49 are electrically connected to an earth or ground line 50.

On the other hand, the amplifier circuit 42 has a drive transistor 51 whose base is electrically connected between the collector of the input transistor 44 and the collector of the transistor 49. The collector of the drive transistor 51 is electrically coupled to the power line 46 through a resistor 52, whereas the emitter thereof is electrically connected to the ground line 50 via a resistor 53. In addition, the emitter of the drive transistor 51 is electrically coupled to the base of an output transistor 54. The collector of the output transistor 54 is electrically coupled to the power line 46 through a constant-current circuit 55, whereas the emitter thereof is electrically connected to the ground line 50.

Then, a phase-compensating capacitor 56 is electrically connected between the collector of the input transistor 44 serving as the output of the amplifier circuit 41 and the collector of the output transistor 54 serving as the output of the amplifier circuit 42. The phase-compensating capacitor 56 is provided to prevent the phase of an output signal of the amplifier circuit 42 from producing a 180° phase shift or greater with respect to the phase of a signal input to the amplifier circuit 41.

Thus, when the input (minus input IN−) applied to the base of the input transistor 43 is higher in potential level than the input (plus input IN+) applied to the base of the input transistor 44 in the amplifier circuit 41, current flowing in a base junction (node) A of the drive transistor 51 through the input transistor 44 from the constant-current circuit 45 increases. As a result, the drive transistor 51 is turned on to bring the output transistor 54 into an on state, thereby causing the potential of the output signal OUT from the amplifier circuit 42 to drop toward ground or GND potential.

On the other hand, when the base input of the input transistor 43 is lower in potential level than that of the input transistor 44, current flowing into the transistor 48 through the input transistor 43 from the constant-current circuit 45 increases. Hence, the current is about to flow into the transistor 49 in the same manner as described above. As a result, the potential at the node A is reduced, and the drive transistor 51 is hence turned off to bring the output transistor 54 into an off state, thereby causing the potential of the output signal OUT from the amplifier circuit 42 to be raised toward a supply voltage VCC.

In this manner, the amplifier circuit 42 can produce a desired output signal OUT based on the minus input IN− and the plus input IN+ as the input signals applied to the amplifier circuit 41.

In the OP amp circuit referred to above, however, the potential at the node A is reduced to potential near the GND potential when the potential of the output signal OUT of the amplifier circuit 42 is saturated at the supply voltage VCC, i.e., reaches the saturation supply voltage VCC. Then, when the base input of the input transistor 48 is higher in potential level than the base input of the input transistor 44 and the potential of the output signal OUT from the amplifier circuit 42 is about to drop toward the GND potential, current, which is about to flow in the node A through the input transistor 44, flows into the phase-compensating capacitor 56, which is, in turn, charged by the current. Therefore, an increase in the potential at the node A is delayed only during a period in which the phase-compensating capacitor 56 is being charged, and the drive transistor 51 and the output transistor 54 are not turned on immediately. As a result, the output signal OUT of the amplifier circuit 42 still remains saturated at the supply voltage VCC, thereby causing a problem that a response delay occurs in a transition waveform of the output whose potential drops toward the GND potential.

SUMMARY OF THE INVENTION

With the foregoing problem in view, it is therefore an object of the present invention to provide an operational amplifier circuit capable of preventing a response delay from occurring in a transition waveform of the output from an amplifier circuit as a second stage upon the charging of a phase-compensating capacitor provided between the output of an amplifier circuit as a first stage and the amplifier circuit as the second stage.

According to the present invention, there is provided an operational amplifier circuit including a differential-amplification type amplifier circuit as a first stage; an amplifier circuit as a second stage electrically connected to the output of the amplifier circuit of the first stage and provided with an output transistor for amplifying a signal output from the amplifier circuit of the second stage; and a phase-compensating capacitor electrically connected between the output of the amplifier circuit of the first stage and the output of the amplifier circuit of the second stage for thereby compensating for the phase difference between a signal input to the amplifier circuit of the first stage and a signal output from the amplifier circuit of the second stage, which comprises a potential holding circuit for maintaining, at a predetermined value, the potential at a node between the amplifier circuit of the first stage and the amplifier circuit of the second stage when the amplifier circuit of the first stage delivers a signal to the amplifier circuit of the second stage.

According to the arrangement of this operational amplifier circuit, when the potential at the node between the amplifier circuit of the first stage and the amplifier circuit of the second stage is reduced, the potential holding circuit is activated to maintain the node potential at a given value, thereby preventing the node potential from dropping. It is therefore possible to prevent a response delay from occurring in a transition waveform of an output from the amplifier circuit of the second stage upon the charging of the phase-compensating capacitor.

The above and other objects, features and advantages of the present invention will become apparent from the following description and the appended claims, taken in conjunction with the accompanying drawings in which preferred embodiments of the present invention are shown by way of illustrative example.

DETAILED DESCRIPTION OF THE PREFERRED EMBODIMENTS

Figure 1:
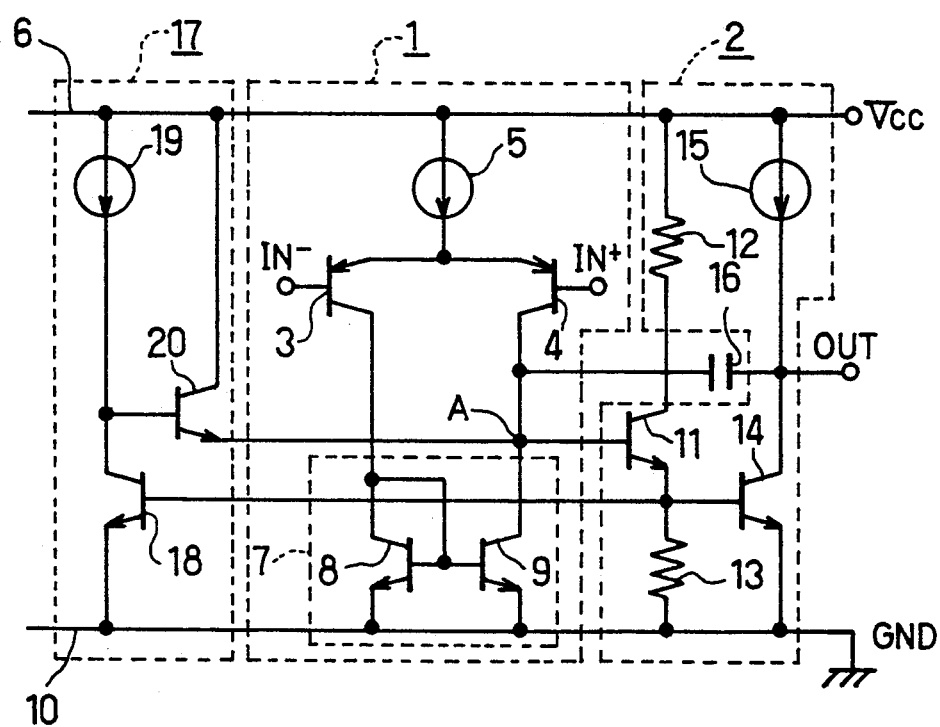
FIG. 1 is a diagram showing a circuit configuration of an operational amplifier according to a first embodiment which embodies the present invention.

A first embodiment, which embodies an operational amplifier circuit of the present invention, will hereinafter be described in detail with reference to FIGS. 1 and 2. FIG. 1 shows a circuit configuration of an operational amplifier (hereinafter abbreviated as "OP amp") which is equivalent to the operational amplifier circuit according to the present embodiment.

The OP amp is formed on a semiconductor chip, and comprises a differential-amplification type amplifier circuit 1 as a first stage and an amplifier circuit 2 as a second stage. The amplifier circuit 1 has a pair of first and second PNP-type input transistors 3, 4 which are emitter-coupled to each other. The base of the first input transistor 3 is used as a minus or negative input IN− side and supplied with an input signal, whereas the base of the second input transistor 4 is used as a plus or positive input IN+ side and supplied with an input signal. The emitters of the first and second input transistors 3, 4 are electrically connected to a power line 6 through a first constant-current circuit 5. The collectors of the first and second input transistors 3, 4 are respectively electrically connected to the collectors of third and fourth NPN-type transistors 8, 9 which constitute a current mirror circuit 7. The emitters of the third and fourth transistors 8, 9 are electrically connected to an earth or ground line 10. On the other hand, the amplifier circuit 2 has an NPN-type drive transistor 11 whose base is electrically connected to a node A between the collector of the second input transistor 4 and the collector of the fourth transistor 9. The drive transistor 11 has the collector electrically connected to the power line 6 through a resistor 12 and the emitter electrically connected to the ground line 10 through a resistor 13. The emitter of the drive transistor 11 is electrically connected to the base of an NPN-type output transistor 14. The collector of the output transistor 14 is electrically connected via a second constant-current circuit 15 to the power line 6, whereas the emitter thereof is electrically connected to the ground line 10.

In addition, a phase-compensating capacitor 16 is electrically connected between the collector of the second input transistor 4 which serves as an output terminal side of the amplifier circuit 1 and the collector of the output transistor 14 which serves as an output terminal side of the amplifier circuit 2. The phase-compensating capacitor 16 is provided to prevent the phase of an output signal OUT of the amplifier circuit 2 from producing a 180° phase shift or greater with respect to the phase of an input signal of the amplifier circuit 1.

Thus, when the base input (minus input IN−) of the first input transistor 3 is higher in potential level than the base input (plus input IN+) of the second input transistor 4 in the amplifier circuit 1, current flowing into the node A via the second input transistor 4 from the first constant-current circuit 5 increases. As a result, the drive transistor 11 is turned on to bring the output transistor 14 into an on state, thereby causing the potential of the output signal OUT from the amplifier circuit 2 to drop toward ground or GND potential.

On the other hand, when the base input of the first input transistor 3 is lower in potential level than that of the second input transistor 4, current flowing into the third transistor 8 from the first constant-current circuit 5 via the first input transistor 3 increases. As a result, the potential at the node A is rendered low, and the drive transistor 11 is hence turned off to bring the output transistor 14 into an off state, thereby causing the potential of the output signal OUT from the amplifier circuit 2 to be raised toward a supply voltage VCC.

In this way, the amplifier circuit 2 produces a desired output signal OUT based on the minus input IN− and the plus input IN+ as the input signals applied to the amplifier circuit 1.

In addition, the OP amp according to the present embodiment is provided with a potential holding circuit 17 for maintaining the potential at the node A between the amplifier circuit 1 and the amplifier circuit 2 at a given value when the amplifier circuit 1 generates a signal (i.e., for preventing the potential at the node A from being reduced to potential near the GND potential). The potential holding circuit 17 has a fifth NPN-type transistor 18 whose base is electrically connected to the base of the output transistor 14 and the emitter of the drive transistor 11. Further, the collector of the fifth transistor 18 is electrically coupled to the power line 6 through a third constant-current circuit 19, whereas the emitter thereof is electrically connected to the ground line 10. The base of a sixth transistor 20 is electrically connected to the collector of the fifth transistor 18. The sixth transistor 20 has the collector electrically connected to the power line 6 and the emitter thereof connected to the base of the drive transistor 11, i.e., the node A.

The fifth transistor 18 is set in such a manner that the output potential thereof increases when the potential at the emitter of the transistor 11 and base of the output transistor 14 drops from the normal operating potential or voltage in time to a range of from several mVs to hundreds of mVs. In addition, the sixth transistor 20 is turned on in response to the increase of the output of the fifth transistor 18.

A description will now be made of the operation of the OP amp constructed as described above. Let's now assume that the base input of the first input transistor 3 is lower in potential level than that of the second input transistor 4. At this time, a large current flows from the first constant-current circuit 5 to the third transistor 8 via the first input transistor 3. On the other hand, the current is about to flow even into the fourth transistor 9 in the same manner as described above, thereby reducing the potential at the node A. Therefore, the drive transistor 11 is turned off to bring the output transistor 14 into an off state. Consequently, the potential of the output signal OUT from the amplifier circuit 2 reaches a saturated state at the supply voltage VCC.

Since the potential at the emitter of the drive transistor 11 is low at this time, the fifth transistor 18 is turned off and the sixth transistor 20 is turned on by the third constant-current circuit 19 correspondingly. Therefore, current flows into the node A through the sixth transistor 20 so as to raise the potential at the node A, thereby causing the drive transistor 11 to conduct appreciable current. As a result, the potential at the base of the fifth transistor 18 is raised, thereby causing collector current flow in the same transistor 18. Accordingly, the potential at the base of the sixth transistor 20 is slightly reduced to decrease current flowing into the node A via the sixth transistor 20, thereby making it possible to suppress an increase in the potential at the node A. Thus, the potential at the node A is higher than that of the ground line 10, and is controlled to reach potential near the base potential of the drive transistor 11, for causing the drive transistor 11 to start a turning-on operation.

When the input applied to the base of the first input transistor 3 is higher in potential level than the input applied to the base of the second input transistor 4 in a state in which the potential of the output signal OUT has reached the saturation supply voltage VCC, no current is present in the first input transistor 3, and the current, which is about to flow into the node A via the second input transistor 4 from the first constant-current circuit 5, flows even in the phase-compensating capacitor 16, which is, in turn, charged by the current. Therefore, an increase in the potential at the node A is delayed only during a period in which the charging of the phase-compensating capacitor 16 is being carried out.

At this time, the potential holding circuit 17 is activated to maintain the potential at the node A at the potential near the base potential of the drive transistor 11, for initiating the turning-on action of the drive transistor 11. Therefore, the potential at the node A immediately reaches potential more than or equal to the base potential thereof for turning on the drive transistor 11, thereby making it possible to turn on the drive transistor 11. That is to say, the OP amp provided with the phase-compensating capacitor 16 between the output of the amplifier circuit 1 and the output of the amplifier circuit 2 can avoid a response delay which occurs in a transition waveform of an output from the amplifier circuit 2 by the charging of the phase-compensating capacitor 16.

Figure 2:
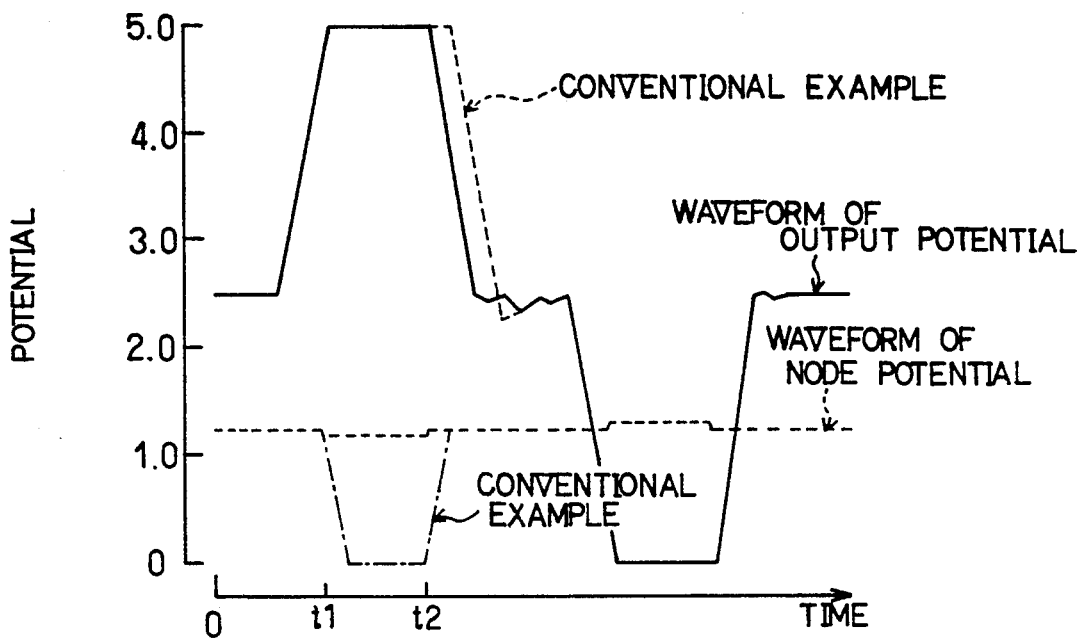
FIG. 2 is a diagram for describing the result of simulation done by the representation of a waveform of electrical potential output from the operational amplifier shown in FIG. 1 and the representation of a waveform of electrical potential at a nodal point of the operational amplifier by means of computer simulation.

FIG. 2 shows the result of simulation done by the representation of a waveform of electrical potential output from the OP amp and the representation of a waveform of electrical potential at the node A of the OP amp by means of operations performed by a computer. As is apparent from FIG. 2, a drop in the potential at the node A is hardly developed even when the output potential has reached a saturation high level at time t1. Accordingly, the potential at the node A is maintained at a given level. Therefore, a response delay does not occur in the transition waveform of the output when the output potential varies with a change in the input level at time t2. The OP amp makes it unnecessary to take into consideration the response delay which occurs in the output transition. It is thus understood that the waveforms of the potential output from the OP amp can ensure response characteristics which are substantially symmetric with each other as viewed from the plus and minus sides. On the other hand, in the conventional OP amp, the potential at the node drops at the time t1 as indicated by the dashed line, so that the waveform of the output potential at time t2 causes a time delay as indicated by the broken line.

Figure 3:
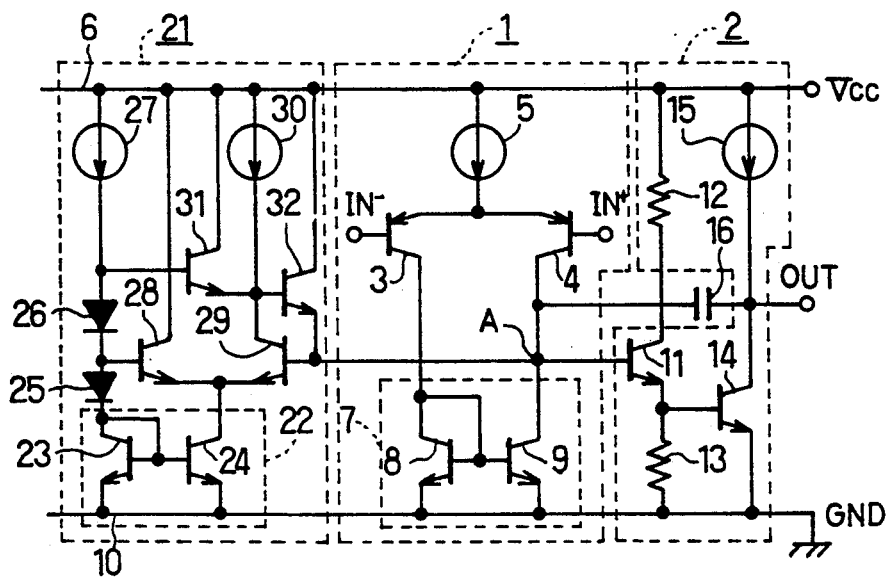
FIG. 3 is a diagram illustrating a circuit configuration of an operational amplifier according to a second embodiment which embodies the present invention.

A second embodiment, which embodies an operational amplifier circuit of the present invention, will now be described below with reference to FIG. 3. Incidentally, the same elements of structure as those employed in the first embodiment will be identified by like reference numerals and will not be described. Therefore, a description will be made of the difference between the first and second embodiments.

An OP amp according to the present embodiment differs in the structure of a potential holding circuit 21 from the OP amp according to the first embodiment. The potential holding circuit 21 has seventh and eighth NPN-type transistors 23, 24 which constitute a current mirror circuit 22. The emitter of each of these transistors 23, 24 is electrically connected to an earth or ground line 10. The seventh transistor 23 has the collector to which the cathode of a diode 25 series-connected with a diode 26 in pairs is electrically connected. The anode of the diode 26 is electrically connected to a power line 6 through a fourth constant-current circuit 27.

The potential holding circuit 21 also has ninth and tenth NPN-type transistors 28, 29 which are emitter-coupled to each other. The base of the ninth transistor 28 is electrically connected between the diodes 25 and 26, whereas the collector thereof is electrically coupled to the power line 6. The collector of the tenth transistor 29 is electrically connected to the power line 6 via a fifth constant-current circuit 30, whereas the base thereof is electrically connected to a node A, i.e., the base of a drive transistor 11. Further, the emitter of each of the ninth and tenth transistors 28, 29 is electrically connected to the collector of the eighth transistor 24.

Further, the base of an eleventh transistor 31 is electrically connected between the fourth constant-current circuit 27 and the diode 26. The collector of the eleventh transistor 31 is electrically connected to the power line 6 and the emitter thereof is electrically connected to the collector of the tenth transistor 29 and the base of a twelfth transistor 32. As a result, the potential holding circuit 21 compensates for the high impedance with respect to the node A. The collector of the twelfth transistor 32 is electrically connected to the power line 6, whereas the emitter thereof is electrically connected to the base of the tenth transistor 29 and the node A.

According to the potential holding circuit 21 employed in the present embodiment, the fourth constant-current circuit 27 and the diodes 26, 25 causes the current mirror circuit 22 to conduct current of a constant level at all times. In addition, this constant current is supplied even to the bases of the ninth transistor 28 and the eleventh transistor 31. Thus, when the potential at the node A is high, the tenth transistor 29 is turned on. On the other hand, when the potential at the node A is low, the tenth transistor 29 is turned off and the twelfth transistor 32 is turned on in place of the tenth transistor 29. Consequently, the twelfth transistor 32 causes current flow in the node A, thereby making it possible to suppress a drop in the potential at the node A.

Thus, similarly to the first embodiment, the OP amp according to the present embodiment enables the potential at the node A to be always maintained at the potential near the normal operating base potential of the drive transistor 11, for initiating the turning-on action of the drive transistor 11 in a state in which the potential of the output signal OUT from an amplifier circuit 2 as a second stage has reached a saturation supply voltage VCC.

As a result, an output transistor 14 is immediately turned on, so that the potential of the output signal OUT from the amplifier circuit 2 is immediately reduced toward the GND potential. That is to say, the OP amp provided with a phase-compensating capacitor 16 between the output of an amplifier circuit 1 as a first stage and the output of the amplifier circuit 2 can prevent a response delay from occurring in a transition waveform of an output from the amplifier circuit 2 upon the charging of the phase-compensating capacitor 16.

Figure 4:
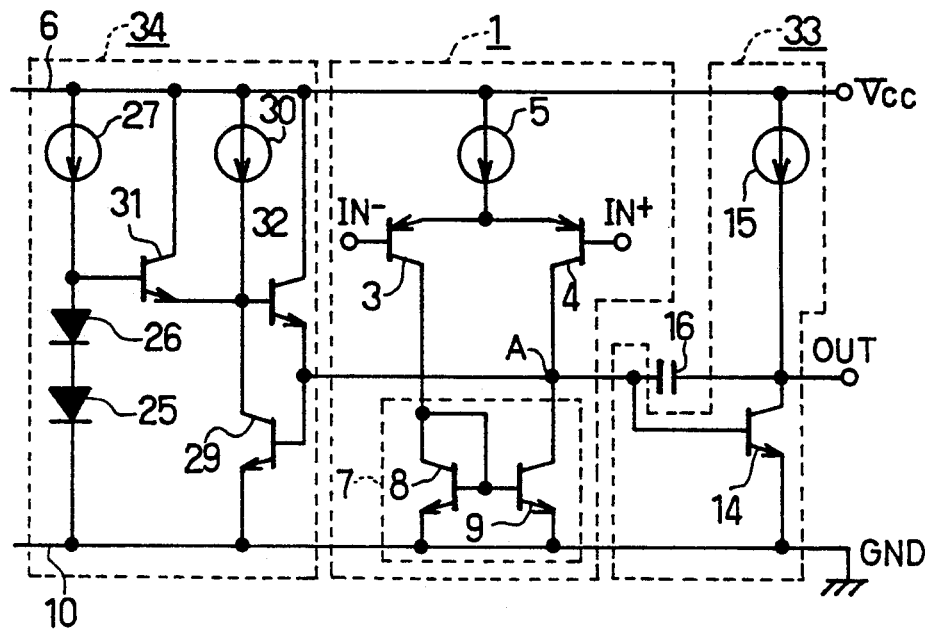
FIG. 4 is a diagram depicting a circuit configuration of an operational amplifier according to a third embodiment which embodies the present invention.
Figure 5:
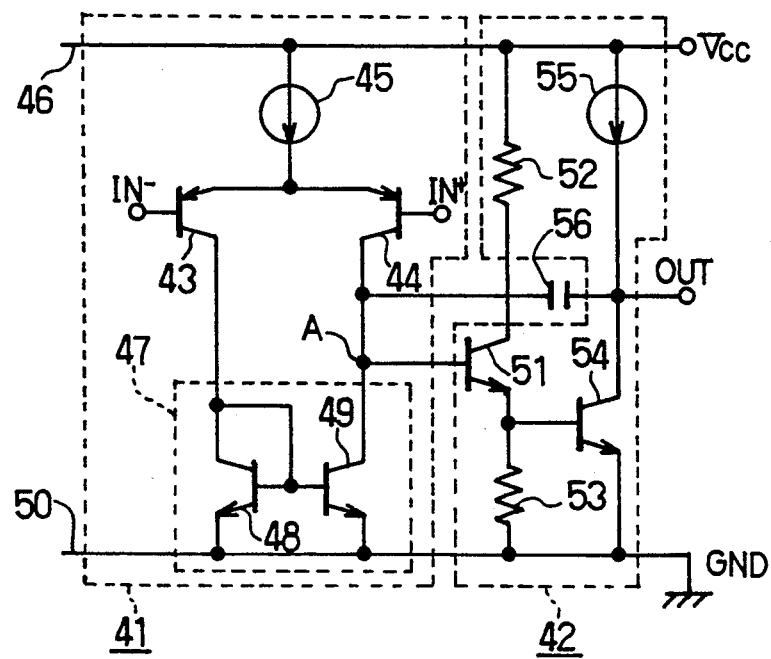
FIG. 5 is a diagram showing a circuit configuration of a conventional operational amplifier.

A third embodiment, which embodies an operational amplifier circuit of the present invention, will now be described below with reference to FIG. 4. An OP amp according to the present embodiment differs in the structure of each of an amplifier circuit 33 as a second stage and a potential holding circuit 34 from the OP amp of each of the first and second embodiments.

The amplifier circuit 33 has a circuit configuration in which the drive transistor 11 and the resistors 12, 13 are eliminated from the amplifier circuit 2 employed in each of the first and second embodiments. More specifically, the collector of an output transistor 14 is electrically connected to a power line 6 via a second constant-current circuit 15, whereas the emitter thereof is electrically connected to an earth or ground line 10. In addition, the base of the output transistor 14 is electrically connected to an amplifier circuit 1 as a first stage at a node A. A phase-compensating capacitor 16 is electrically connected between the node A and the collector of the output transistor 14.

On the other hand, the potential holding circuit 34 has a circuit configuration in which the current mirror circuit 22 and the ninth transistor 28 are omitted from the potential holding circuit 21 employed in the second embodiment. More specifically, the anode of a diode 26 series-connected with a diode 25 is electrically connected to the power line 6 through a fourth constant-current circuit 27, whereas the cathode thereof is electrically coupled to the ground line 10. Then, the collector of a tenth transistor 29 is electrically connected to the power line 6 through a fifth constant-current circuit 30, whereas the base thereof is electrically connected to the node A, i.e., the base of the output transistor 14. In addition, the emitter of the tenth transistor 29 is connected to the ground line 10. Connected between the fourth constant-current circuit 27 and the diode 26 is the base of an eleventh transistor 31. The collector of the eleventh transistor 31 is electrically connected to the power line 6, whereas the emitter thereof is electrically connected to the collector of the tenth transistor 29 and the base of a twelfth transistor 32. The collector of the twelfth transistor 32 is electrically connected to the power line 6, whereas the emitter thereof is electrically coupled to the base of the tenth transistor 29 and the node A.

According to the potential holding circuit 34 employed in the present embodiment, the fourth constant-current circuit 27 supplies current of a constant level to the base of the eleventh transistor 31. Thus, when the potential at the node A is high, the tenth transistor 29 is turned on. On the other hand, when the potential at the node A is low, the tenth transistor 29 is turned off, so that the twelfth transistor 32 is turned on to supply current to the node A, thereby making it possible to avoid or suppress a drop in the potential at the node A.

Thus, in a manner similar to each of the aforementioned embodiments, the OP amp according to the present embodiment enables the potential at the node A to be always maintained at the potential near the normal operating base potential for initiating the turning-on action of the output transistor 14 in a state in which the potential of the output signal OUT from the amplifier circuit 33 has reached a saturation supply voltage VCC.

As a result, the output transistor 14 is immediately turned on, so that the potential of the output signal OUT from the amplifier circuit 33 promptly drops toward the GND potential. That is to say, the OP amp provided with the phase-compensating capacitor 16 between the output of the amplifier circuit 1 and the output of the amplifier circuit 33 can prevent a response delay from occurring in a transition waveform of an output from the amplifier circuit 33 upon the charging of the phase-compensating capacitor 16.

Incidentally, the present invention is not necessarily limited to each of the aforementioned embodiments. It will be apparent that the present invention can also be practiced in the following manner by suitably modifying portion of the arrangement of the present invention within a scope not departing from the essence of the present invention.

(1) According to each of the embodiments referred to above, the current mirror circuit 7 has been electrically connected as a load used for the first and second input transistors 3, 4 emitter-coupled to each other in the amplifier circuit 1. However, a circuit composed of resistors or the like may be connected as a load for the above transistors.

(2) According to each of the aforementioned embodiments, the first and second PNP-type input transistors 3, 4 emitter-connected to each other have been provided in the amplifier circuit 1. However, a pair of NPN-type input transistors emitter-coupled to each other may be provided.

(3) According to each of the above-described embodiments, each of the transistors takes a bipolar type of construction. However, each transistor may be a MOS type of construction.

What is claimed is:

1. An operational amplifier circuit including a first stage consisting of a differential-amplification type amplifier circuit having at least one input and an output; a second stage consisting of an amplifier circuit having an input electrically connected to said output of said first stage amplifier circuit and provided with an output transistor with an input and an output; and a phase-compensating capacitor electrically interconnecting said output of said first stage amplifier circuit with said output of said output transistor for compensating for the phase difference between a signal applied to said one input of said first stage amplifier circuit and a signal at said output of said transistor in said second stage, comprising:

a potential holding circuit coupled to a node in the connection between said input of said second stage amplifier circuit and said output of said first stage amplifier circuit for maintaining at a predetermined value the potential at said node when said first stage amplifier circuit delivers a signal to said second stage amplifier circuit.

2. An operational amplifier circuit according to claim 1 wherein a drive transistor interconnects said second stage amplifier circuit input with said input of said output transistor for controlling said output transistor as a function of the potential at said node.

3. An operational amplifier circuit according to claim 2, wherein said drive transistor has either a base or gate electrode coupled to said second stage amplifier circuit input for receiving input signals from said node, and said predetermined value is selected to be near the cut-off potential for said base or gate electrode.

4. An operational amplifier circuit according to claim 2, wherein an output of said drive transistor is coupled to said potential holding circuit for controlling the potential at said node as a function of the potential at said output of said drive transistor, said node potential being maintained at said predetermined value where said drive transistor is non-conducting.

5. An operational amplifier circuit according to claim 4, wherein each transistor of said operational amplifier circuit is a bipolar type.

6. An operational amplifier circuit according to claim 4, wherein said amplifier circuit of said first stage comprises emitter-coupled bipolar transistors.

7. An operational amplifier circuit according to claim 4, wherein each transistor of said operational amplifier circuit is a MOS type.

8. An operational amplifier circuit according to claim 4, wherein said potential holding circuit has a constant-current source and is activated to supply current from said constant-current source to said node when said node potential is low, thereby maintaining said node potential at said predetermined value.

9. An operational amplifier circuit according to claim 1, wherein said potential holding circuit is activated to apply potential to said node and to supply current to said node when said node potential is low, thereby maintaining said node potential at said predetermined value.

10. An operational amplifier circuit according to claim 9, wherein each transistor of said operational amplifier circuit is a bipolar type.

11. An operational amplifier circuit according to claim 9, wherein said amplifier circuit of said first stage comprises emitter-coupled bipolar transistors.

12. An operational amplifier circuit according to claim 9, wherein each transistor of said operational amplifier circuit is a MOS type.

13. An operational amplifier circuit according to claim 9, wherein said potential holding circuit has a constant-current source and is activated to supply current from said constant-current source to said node when said node potential is low, thereby holding said node potential constant.

14. An operational amplifier circuit according to claim 9, wherein said output transistor has either a base or gate electrode coupled to said second stage amplifier circuit input for receiving input signals from said node, and said predetermined value is selected to be near the cut-off potential for said base or gate electrode.

15. An operational amplifier circuit according to claim 9 wherein a drive transistor interconnects said second stage amplifier circuit input with said input of said output transistor for controlling said output transistor as a function of the potential at said node.

16. An operational amplifier circuit according to claim 15, wherein said drive transistor has either a base or gate electrode coupled to said second stage amplifier circuit input for receiving input signals from said node, and said predetermined value is selected to be near the cut-off potential for said base or gate electrode.

* * * * *